United States Patent [19]

William

[11] 3,858,154

[45] Dec. 31, 1974

[54] SLIDING THREE DIMENSIONAL PACKAGING TECHNIQUE

[75] Inventor: A. Reimer William, Wheaton, Ill.

[73] Assignee: GTE Automatic Electric Laboratories Incorporated, Northlake, Ill.

[22] Filed: Nov. 2, 1973

[21] Appl. No.: 412,525

[52] U.S. Cl.... 339/17 LM, 317/101 D, 339/75 MP, 339/176 MP

[51] Int. Cl......................... H01r 33/18, H05k 1/12

[58] Field of Search......... 339/17, 18, 75, 176, 273, 339/274, 174; 317/101 D, 101 DH

[56] References Cited

UNITED STATES PATENTS

| | | | |
|---|---|---|---|
| 2,881,404 | 4/1959 | Kamm | 339/17 LM |
| 2,956,141 | 10/1960 | Smith | 339/17 LM X |
| 3,138,675 | 6/1964 | Krove | 339/17 LC X |
| 3,149,893 | 9/1964 | Dupre | 339/176 MP |
| 3,399,372 | 8/1968 | Uberbacher | 339/17 L |
| 3,430,182 | 2/1969 | Blanche | 339/126 R |

*Primary Examiner*—Roy D. Frazier
*Assistant Examiner*—Terrell P. Lewis
*Attorney, Agent, or Firm*—Robert F. Van Epps

[57] ABSTRACT

Apparatus incorporating a novel three-dimensional systems packaging technique facilitating the implementation of direct electrical interconnections between a plurality of printed circuit cards thereby eliminating the routing of electrical signal paths to the card edges. The apparatus basically comprises a plurality of connector cards having contact means mounted thereon for establishing electrical connections directly therethrough. As the printed circuit cards are interleaved between the connector cards, the contacts slide on a track correspondingly disposed on the circuit cards. After insertion, the circuit cards are displaced, e.g., downward, so that the contacts slide from the tracks onto corresponding circuit access points disposed adjacent to the tracks, establishing an electrical connection between the adjacent circuit cards. Plated-through holes are also provided to interconnect circuit access points on opposite sides of the circuit card.

3 Claims, 6 Drawing Figures

SLIDING THREE DIMENSIONAL PACKAGING TECHNIQUE

BACKGROUND OF THE INVENTION

This invention relates to apparatus incorporating a novel three-dimensional electronic systems packaging technique for electrically interconnecting printed wiring circuit cards.

Reference may be made to the following U.S. Pat. Nos. 3,552,750; 3,609,463; 3,448,345; 3,403,300; 3,616,532; 3,368,115; and 3,715,629.

Large electronic systems such as electronic telephone switching systems commonly employ a number of electrically interconnected printed wiring circuit cards mounted in card file frames. Of course, as the systems are enlarged and/or become more complex, systems packages occupying the same or even less space than has heretofore been practicable may be required in order to meet restrictive "available space" limitations.

Until recently, however, prior art techniques used to electrically interconnect printed circuit cards have generally been, conceptually speaking, planar and therefore not conductive to compact systems packaging. That is, intercard connections have been established in these prior art systems by routing conductive strips from each of the circuit signal points being interconnected to the rear edge of the respective circuit cards. The cards are commonly mounted by their rear edges in a "backplane" connection panel positioned normal thereto at the back of the card file frame. In addition to mounting the circuit cards, the backplane panel electrically interconnects the printed circuit cards by establishing selective electrical contact with the conductors routed to the rear edges of the cards. Alternatively, intercard connections can be accomplished by means of electrical cables mounted on the edge of the circuit cards.

Regardless of whether a backplane panel or cables are utilized, however, because all intercard connections are routed to the back (or front) edges of the circuit cards, the number of intercard connections that can be established is limited by the physical dimensions of the card edges. Moreover, an aisle is generally provided behind the card file frame to permit testing or servicing of the equipment. Although some space can be saved by utilizing a single aisle to service two card file frames arranged to abut the same aisle, for the most part, the aisle is unused during normal operation.

Accordingly, three-dimensional intercard wiring techniques have been devised to increase electronic systems packaging densities while maintaining or improving the heat dissipation characteristics of the equipment. Three-dimensional wiring is advantageous in that intercard connections can be made directly between circuit cards without routing the signals to the rear edge of the circuit cards for connection to a second level wiring plane, i.e., the backplane connector panel, interconnecting the circuit cards.

One of two present basic three-dimensional approaches is the "cordwood" technique wherein axial-lead electronic circuit components are mounted between two wiring planes or boards to complete the connection between the circuit wiring patterns disposed thereon, giving the components an appearance of being stacked on one another. This approach, however, requires specialized assembly techniques, and because the components are permanently mounted between the wiring planes, it is normally unrepairable. Thus, the entire package must be discarded if there is a failure.

The other basic three-dimensional approach is the "coax" technique. With this approach, the circuit components are mounted on a single board and several layers of conductive strips, separated by layers of insulation, interconnect the electrical components to provide a plurality of circuits. Three-dimensional wiring patterns are then established by metallic deformation of a series of insulated dot connections between the wiring layers. While the thermal dissipation properties of the "coax" package are quite good, specialized component enclosures are required to obtain high packaging densities. Moreover, many small cards are required to provide the circuitry that would normally mount on a single printed wiring card. For example, it is estimated that an 8,000 word $x$ 9 bit memory that could ordinary be mounted on a single printed wiring card would require 200 wiring cards if the "coax" approach is utilized. Further, a high degree of skill is required both for assembly and maintenance of the circuit packages.

Three-dimensional packaging is advantageous, however, in that the number of intercard connections that can be made is not limited by the physical dimensions of the edges of the circuit cards. Also, because the back edges of the cards are not utilized in effecting intercard connections, backplane wiring is eliminated thereby conserving office space by eliminating the aisle behind the card file frame.

SUMMARY OF THE INVENTION

In accordance with the present invention, there is provided three-dimensional electronic systems packaging apparatus for implementing the direct electrical interconnection of printed circuit cards in a card file frame and thereby eliminating the routing of electrical signal paths to the edges of the printed circuit cards. More particularly, the apparatus comprises a plurality of connector cards, each having contact means mounted thereon for establishing electrical connections directly through the connector card. As printed circuit cards are interleaved between the connector cards, the contact means on adjacent connector cards slide on tracks comprising a hard insulating material disposed on opposite sides of the circuit card. Upon being fully inserted into the card file frame, the circuit cards are displaced normal to the direction of insertion in the insertion plane, e.g., downward, so that the contact means slidably contact circuit access means disposed on both sides of the circuit card adjacent to the tracks. The circuit access means, in turn, provide direct access to the circuit signal points on the printed circuit cards being interconnected. Further, corresponding circuit access means on opposite sides of the printed circuit card may be electrically interconnected by conductor means passing through the circuit card to establish direct intercard connections between any number of adjacent printed circuit cards.

BRIEF DESCRIPTION OF THE DRAWINGS

The invention may be best understood, however, by reference now to the following description taken in conjunction with the accompanying drawings, in which like reference numerals identify like elements in the several figures and in which.

DETAILED DESCRIPTION

With general reference now to the accompanying drawings, there is shown apparatus in accordance with the present invention wherein connector cards are interleaved with printed circuit cards in a card file or frame to selectively establish direct electrical connections between adjacent circuit cards.

Figure 1:
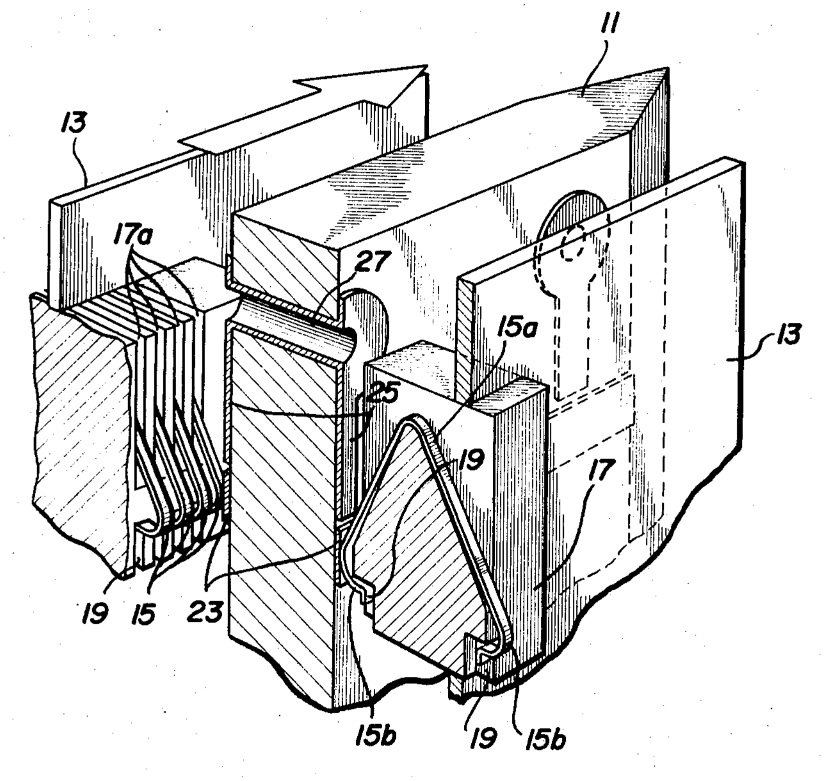
FIG. 1 is a partial sectional view in perspective showing apparatus in accordance with the present invention comprising a modified printed circuit card inserted between a pair of adjacent connector cards.
Figure 2:
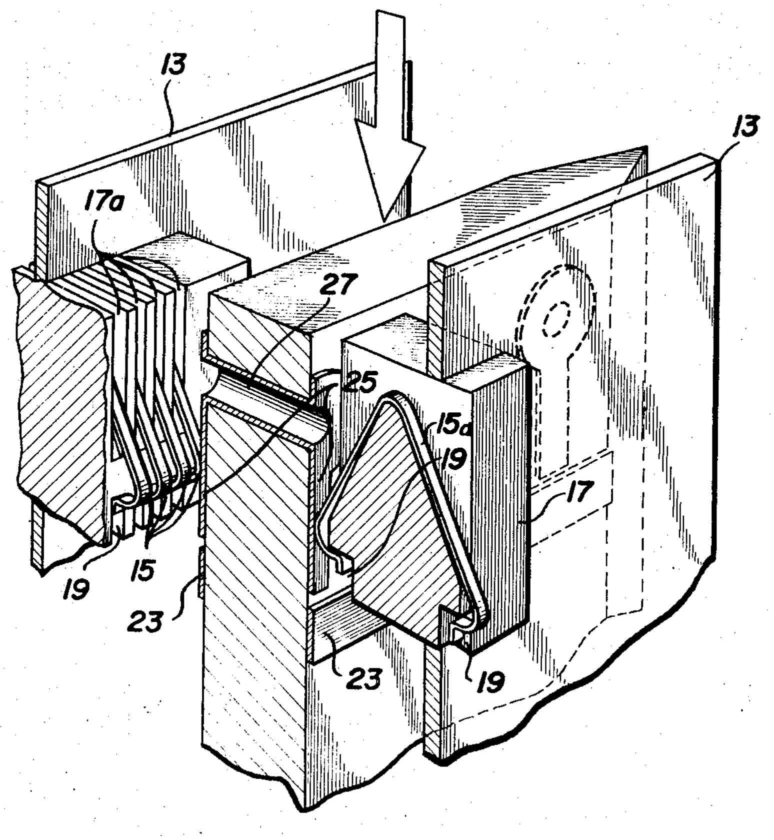
FIG. 2 is a partial sectional view in perspective showing the printed circuit card of FIG. 1 displaced downward after insertion to establish contact between the contact means and the circuit access means.

Referring now in particular to FIGS. 1 and 2, the present invention will be described in greater detail. As shown in FIG. 1, a printed circuit card 11 is initially inserted between a pair of adjacent connector cards 13 removably mounted, for example, in a card file frame (not shown).

A plurality of electrically conductive spring contacts 15 are positioned in intercard connector plugs 17 which mount in corresponding apertures in the connector cards 13 so that the contacts 15 extend therethrough to physically engage adjacent printed circuit cards 11. More specifically, each contact 15 comprises a substantially V-shaped resilient spring member 15*a* supportably mounted in a corresponding channels or slots 17*a* in a rectangular block of insulating material comprising the intercard connector plug 17. Each slot 17*a* in plug 17 defines a substantially V-shaped core 17*b* on which the corresponding spring member 15*a* is positioned. The ends of the V-shaped spring member 15 are directed inwardly, each comprising a substantially S-shaped portion 15*b* which extends into a notch, identified generally at 19, in the intercard connector plug 17 to prevent the accidental detachment of spring contact 15 from plug 17.

Figure 3:
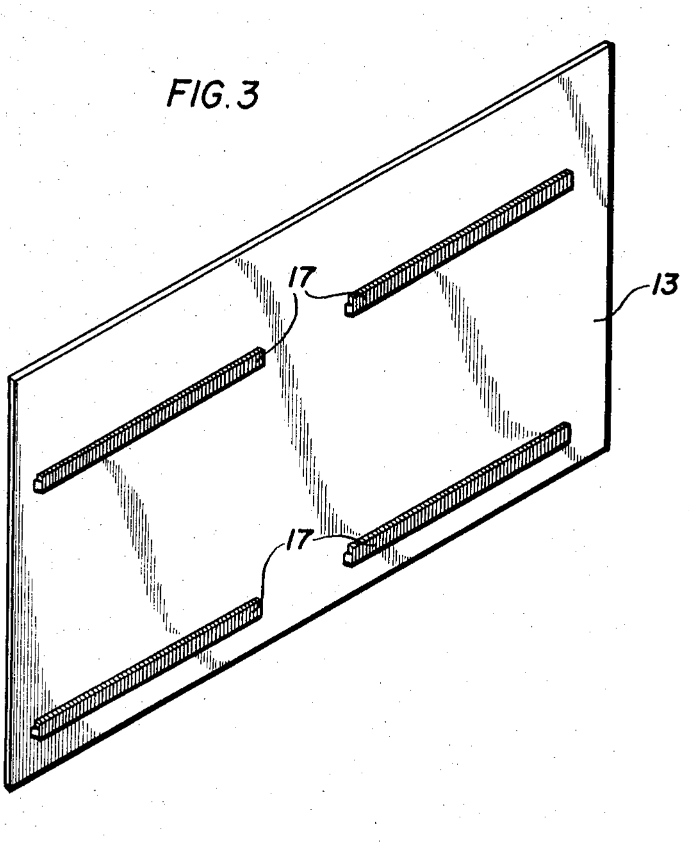
FIG. 3 is a perspective view of a connector card in accordance with the present invention.

A connector card 13 having several intercard connectors 17 mounted thereon is shown in FIG. 3. In accordance with the present invention, the intercard connectors 17 are aligned to be parallel to the direction in which the printed circuit card 11 is inserted into the card file frame. Thus, as the printed circuit card 11 is inserted between an adjacent pair of connector cards 13, the rear edge of the circuit card 11, which is inserted first, sequentially engages the spring contacts 15, minimizing the insertion force required.

Figure 4:
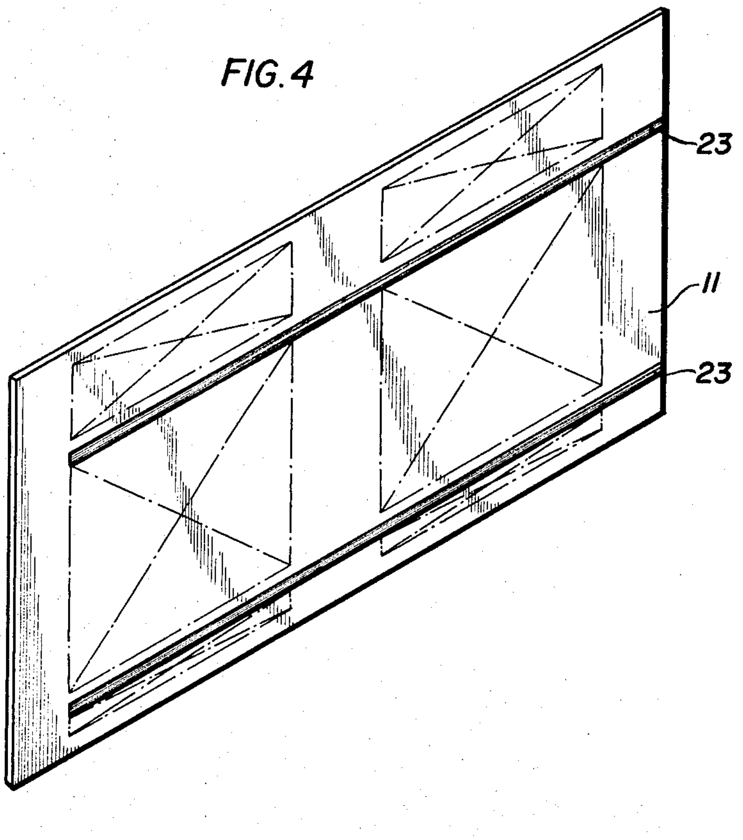
FIG. 4 is a perspective view of a printed circuit card in accordance with the present invention.

In FIG. 4, a printed circuit card 11 specially adapted in accordance with the present invention is shown. In particular, the circuit card 11 comprises a thin, rigid board having a layer of conductive strips disposed thereon to form the signal wiring pattern for a desired circuit or circuits interconnecting electrical components 21 mounted on the card. Sliding tracks 23, each comprising a layer of hard insulating material, are disposed on both sides of the printed circuit card 11 to engage the spring contacts 15 of the intercard connectors 17 as the circuit card 11 is inserted between a pair of adjacent connector cards 13, as shown in FIG. 1. Thus, the spring contacts 15 slide on the tracks 23 as the circuit card 11 is inserted into the card file frame thereby preventing damage to the circuit card 11 from excessive wear and eliminating the possibility of forming undesirable connections as the card 11 is inserted.

Figure 5:
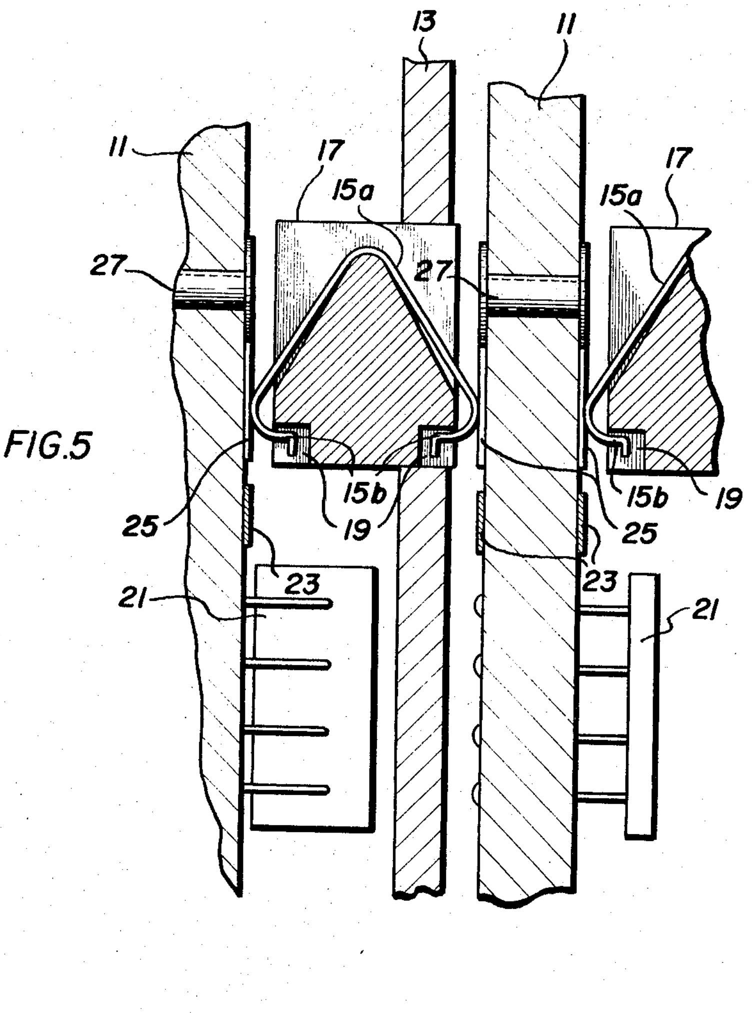
FIG. 5 is a partial side elevational view showing apparatus in accordance with the present invention comprising a printed circuit card disposed between adjacent connector cards having contact means mounted thereon.

Once inserted between the connector cards 13 (FIG. 1), the circuit card 11 is then displaced normal to the direction of insertion in the insertion plane, e.g., downward as shown in FIG. 2, so that the spring contacts 15 is effect slide from the track 23 onto circuit access points 25 adjacent thereto on the printed circuit card 11. It may be clearly seen in FIG. 2 that each circuit access point 25 comprises a metallic strip positioned immediately adjacent the sliding track 23. In turn, a conductive strip (not shown) can be routed across the printed circuit card 11 from a nearby signal point in the circuit disposed thereon to connect with the circuit access point 25. Accordingly, when adjacent printed circuit cards 11 are inserted in the card file frame and shifted downward, as shown in FIG. 5, the opposite ends of the spring contacts 15 contact the corresponding circuit access points 25 on the opposing surfaces of the adjacent printed circuit cards 11 thereby establishing a direct electrical connection between the adjacent circuit cards 11. Moreover, since the circuits disposed on the printed circuit cards 11 are selectively interconnected with the contact access points 25, the circuits on two adjacent printed circuit cards 11 can be electrically interconnected.

In order to effect direct electrical interconnection between more than two immediately adjacent circuit cards 11, a conductive element passing through the printed circuit cards, such as plated-through hole 27 in FIGS. 1 and 2, may be provided to electrically interconnect corresponding circuit access points 25 on opposite sides of the same circuit card 11. Thus, when a plurality of printed circuit cards 11 are interleaved between the connector cards 13, a pre-selected number of these printed circuit cards 11 can be directly interconnected.

Accordingly, there has been shown apparatus in accordance with the present invention which employs a conventional card file frame to hold connector cards used in mounting and electrically interconnecting printed circuit cards thereby facilitating the compact, three-dimensional packaging of complex electronic systems. Electrical conections are established between the printed circuit cards by means of intercard connectors that directly access the surface of the circuit cards (i.e., in planes parallel, not perpendicular, to the direction of printed circuit card insertion), and as a result, the number of connections that can be formed per card is far greater than is possible where only the card edge is used for access.

Figure 6:
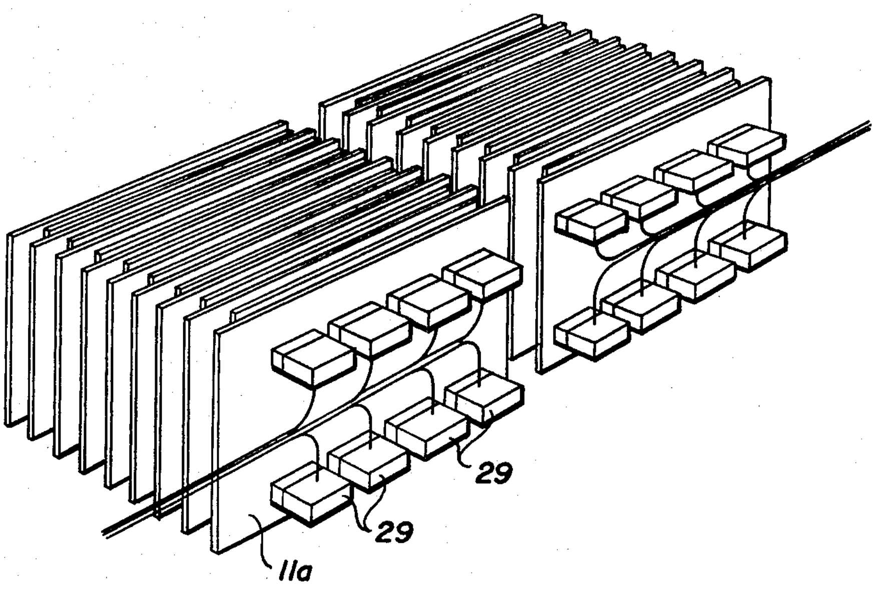
FIG. 6 is a perspective view of a plurality of printed circuit cards interleaved between connector cards and positioned back-to-back in an optimum, space-saving arrangement.

Since all backplane wiring is eliminated in card file frames incorporating the three-dimensional packaging technique of the present invention, several card file frames can be positioned back-to-back, as shown in FIG. 6, thereby eliminating the backplane aisle normally required for servicing and testing. In addition, input signals and power supplies can be coupled directly to an input circuit card 11a (FIG. 6) by means of input connectors 29 which attach directly to the surface of the input card 11a.

Thus, in addition to simplifying individual circuit card layouts, the three-dimensional wiring pattern provided by the intercard connectors simplifies power distribution, as well as facilitating selective signal wiring arrrangements and providing maximum wiring separation where required.

Moreover, by eliminating backplane connections, the available overall card length is greater than would possible in conventional system packages. Accordingly, this additional space may be used either to mount heat dissipating fins on an all-metal card or to provide additional circuitry on a single circuit card.

Although a modified conventional printed wiring circuit card may be used, it may also be desirable to utilize an insulated metal plate for the printed circuit card to improve the thermal dissipation characteristics of the system. If the circuit card comprises a thermally insulated material, however, the connector card should be slightly longer than the circuit card so that heat gathered from the frame air column and the connector springs can be dissipated in the room.

While a particular embodiment of the present invention has been shown and described, it will be obvious to those skilled in the art that various changes and modifications may be made without departing from the invention in its broader aspect. Accordingly, the aim in the appended claims is to cover all such changes and modifications as may fall within the true spirit and scope of the invention.

What is claimed is:

1. Apparatus for electrically interconnecting selected circuit signal points on adjacently positioned printed circuit cards and on a plurality of printed circuit cards comprising:

a plurality of connector cards;

contact means including connector contacts mounted on each of said connector cards and extending between said circuit cards for establishing a direct electrical connection between adjacent ones of said circuit cards;

track means on said circuit cards for engaging and carrying said connector contacts as said circuit cards are positioned adjacent to and on opposite sides of said contact means; and said connector contacts are arranged in rows across each of said connector cards parallel to the direction in which said circuit cards are interleaved between said connector cards and wherein said track means comprises hard insulative strips disposed across both sides of said circuit cards to correspond to said connector contact rows on said connector cards, said connector contacts sliding on said strips as said circuit cards are inserted between said connector cards;

circuit access means disposed on each of said circuit cards adjacent to said track means and coupled to corresponding ones of said selected signal points; and conductor means extending through said circuit cards for electrically interconnecting corresponding ones of said circuit access means on opposite sides of said circuit cards, said circuit cards being repositioned after being positioned adjacent to said contact means so that said connector contacts slide from said track means onto said circuit access means to establish a direct electrical connection between said circuit cards.

2. Apparatus in accordance with claim 1 wherein said circuit access means comprises a plurality conductive elements connected to said selected circuit signal points, said conductive elements being positioned adjacent to said strips on both sides of said circuit card and spaced to correspond to said connector contacts, said circuit card being displaced normal to the direction of insertion of said circuit card in the plane of insertion so that said connector contacts slide from said strips onto said correspondingly spaced conductive elements to electrically interconnect selected ones of said circuit signal points on adjacent ones of said circuit cards.

3. Apparatus in accordance with claim 2 wherein said conductor means comprises a plated-through hole interconnecting corresponding ones of said conductive elements on opposite sides of said circuit card.

* * * * *

UNITED STATES PATENT OFFICE
CERTIFICATE OF CORRECTION

Patent No. 3,858,154 Dated January 30, 1975

Inventor(s) WILLIAM A. REIMER

It is certified that error appears in the above-identified patent and that said Letters Patent are hereby corrected as shown below:

On the second line of the first page, delete "WILLIAM" and insert -- REIMER --.

At line [75] after "inventor" delete "A. REIMER WILLIAM" and insert -- WILLIAM A. REIMER --.

Signed and sealed this 8th day of April 1975.

(SEAL)
Attest:

RUTH C. MASON
Attesting Officer

C. MARSHALL DANN
Commissioner of Patents and Trademarks